(12) United States Patent
Ge et al.

(10) Patent No.: US 9,570,620 B2
(45) Date of Patent: Feb. 14, 2017

(54) MANUFACTURE METHOD OF DUAL GATE OXIDE SEMICONDUCTOR TFT SUBSTRATE AND STRUCTURE THEREOF

(71) Applicant: Shenzhen China Star Optoelectronics Technology Co., Ltd., Shenzhen (CN)

(72) Inventors: Shimin Ge, Shenzhen (CN); Hejing Zhang, Shenzhen (CN); Chihyuan Tseng, Shenzhen (CN); Chihyu Su, Shenzhen (CN); Wenhui Li, Shenzhen (CN); Longqiang Shi, Shenzhen (CN); Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/763,824

(22) PCT Filed: May 21, 2015

(86) PCT No.: PCT/CN2015/079471
 § 371 (c)(1),
 (2) Date: Jul. 28, 2015

(87) PCT Pub. No.: WO2016/165185
 PCT Pub. Date: Oct. 20, 2016

(65) Prior Publication Data
 US 2016/0343872 A1 Nov. 24, 2016

(30) Foreign Application Priority Data

Apr. 14, 2015 (CN) .......................... 2015 1 0175761

(51) Int. Cl.
 *H01L 21/00* (2006.01)
 *H01L 29/786* (2006.01)
 (Continued)

(52) U.S. Cl.
 CPC ....... *H01L 29/78648* (2013.01); *G02F 1/1368* (2013.01); *G02F 1/13439* (2013.01);
 (Continued)

(58) Field of Classification Search
 CPC ....................................................... H01L 33/62
 (Continued)

(56) References Cited

U.S. PATENT DOCUMENTS 6,577,374 B1 * 6/2003 Nakata ................ G02F 1/13394
 349/138
9,129,992 B2 * 9/2015 Zhang ............... H01L 29/78648
 (Continued)

*Primary Examiner* — Caleb Henry
(74) *Attorney, Agent, or Firm* — Leong C. Lei

(57) ABSTRACT

The present invention provides a manufacture method of an oxide semiconductor TFT substrate and a structure thereof. The manufacture method of the dual gate oxide semiconductor TFT substrate utilizes the halftone mask to implement one photo process, which cannot only accomplish the patterning to the oxide semiconductor layer but also obtain the oxide conductor layer (52') with ion doping process, and the oxide conductor layer (52') is employed as being the pixel electrode of the LCD to replace the ITO pixel electrode in prior art; the method manufactures the source (81), the drain (82) and the top gate (71) at the same time with one photo process; the method implements patterning process to the passivation layer (8) and the top gate isolation layer (32) together with one photo process, to reduce the number of the photo processes to nine for shortening the manufacture procedure, raising the production efficiency and lowering the production cost.

7 Claims, 5 Drawing Sheets

(51) Int. Cl.
*H01L 29/24* (2006.01)
*H01L 29/49* (2006.01)
*H01L 27/12* (2006.01)
*G02F 1/1343* (2006.01)
*G02F 1/1368* (2006.01)
*G02F 1/1333* (2006.01)

(52) U.S. Cl.
CPC .......... *H01L 27/124* (2013.01); *H01L 27/127* (2013.01); *H01L 27/1225* (2013.01); *H01L 27/1288* (2013.01); *H01L 29/24* (2013.01); *H01L 29/4908* (2013.01); *H01L 29/7869* (2013.01); *H01L 29/78618* (2013.01); *H01L 29/78696* (2013.01); *G02F 2001/133302* (2013.01); *G02F 2201/123* (2013.01)

(58) Field of Classification Search
USPC .............................................. 257/43; 438/34
See application file for complete search history.

(56) References Cited

U.S. PATENT DOCUMENTS

| | | | | |
|---|---|---|---|---|
| 2008/0254569 A1* | 10/2008 | Hoffman | H01L 29/7869 | 438/104 |
| 2011/0024755 A1* | 2/2011 | Korenari | H01L 27/1214 | 257/59 |
| 2011/0149217 A1* | 6/2011 | Yoon | G02B 5/008 | 349/106 |
| 2011/0151605 A1* | 6/2011 | Yoon | G02B 5/008 | 438/29 |
| 2011/0210347 A1* | 9/2011 | Takeguchi | H01L 29/66765 | 257/88 |
| 2011/0272696 A1* | 11/2011 | Ryu | H01L 27/1225 | 257/59 |
| 2012/0068202 A1* | 3/2012 | Saito | G02F 1/1368 | 257/88 |
| 2012/0146043 A1* | 6/2012 | Kitakado | G02F 1/13624 | 257/72 |
| 2012/0153277 A1* | 6/2012 | Yaginuma | H01L 29/78618 | 257/43 |
| 2012/0153289 A1* | 6/2012 | Kaneko | H01L 29/78633 | 257/59 |
| 2012/0200546 A1* | 8/2012 | Miyamoto | H01L 27/14623 | 345/205 |
| 2013/0309808 A1* | 11/2013 | Zhang | H01L 29/78648 | 438/104 |
| 2014/0273340 A1* | 9/2014 | Van Duren | H01L 21/30604 | 438/104 |
| 2015/0001542 A1* | 1/2015 | Jang | H01L 27/1225 | 257/67 |
| 2015/0060814 A1* | 3/2015 | Noh | H01L 27/3272 | 257/40 |
| 2015/0123084 A1* | 5/2015 | Kim | H01L 27/326 | 257/40 |
| 2015/0179684 A1* | 6/2015 | Van Duren | H01L 27/1259 | 438/14 |
| 2015/0206950 A1* | 7/2015 | Chen | H01L 29/7869 | 257/43 |
| 2015/0279670 A1* | 10/2015 | Cho | H01L 21/02565 | 257/43 |
| 2015/0279674 A1* | 10/2015 | Cho | H01L 21/02631 | 257/43 |
| 2015/0303123 A1* | 10/2015 | Choi | H01L 23/3192 | 257/72 |
| 2015/0325705 A1* | 11/2015 | Choi | G02F 1/134363 | 257/72 |
| 2015/0357480 A1* | 12/2015 | Yu | H01L 21/02554 | 257/43 |
| 2016/0005799 A1* | 1/2016 | Wang | H01L 29/66969 | 257/40 |
| 2016/0013243 A1* | 1/2016 | O'Rourke | H01L 27/14603 | 257/43 |
| 2016/0079385 A1* | 3/2016 | Ellinger | H01L 29/511 | 257/66 |
| 2016/0079429 A1* | 3/2016 | Ellinger | H01L 29/41733 | 257/43 |
| 2016/0131930 A1* | 5/2016 | Sun | G02F 1/136227 | 349/43 |

* cited by examiner

MANUFACTURE METHOD OF DUAL GATE OXIDE SEMICONDUCTOR TFT SUBSTRATE AND STRUCTURE THEREOF

FIELD OF THE INVENTION

The present invention relates to a display technology field, and more particularly to a manufacture method of a dual gate oxide semiconductor TFT substrate and a structure thereof applicable for the LCD.

BACKGROUND OF THE INVENTION

The flat panel display devices possess many merits of thin frame, power saving, no radiation, etc. and have been widely used. The present flat panel display devices at present mainly comprise the Liquid Crystal Display (LCD) and the Organic Light Emitting Display (OLED).

The thin film transistor (TFT) is an important component of the flat panel display device. The TFTs can be formed on a glass substrate and a plastic substrate and generally employed as switch elements and driving elements utilized such as flat panel displays, LCDs, OLEDs and et cetera.

The oxide semiconductor TFT technology is the most popular skill at present. Because the oxide semiconductor has higher electron mobility and in comparison with the Low Temperature Poly-silicon (LTPS), the oxide semiconductor manufacture process is simpler and possesses higher compatibility with the amorphous silicon process, it can be applicable to the skill fields of LCD, OLED flat panel display devices and etc. Because it fits the new generation production lines and has possible applications for displays with Large, Middle and Small sizes. The oxide semiconductor has the great opportunity of application development.

At present, in the active array flat panel display device, the TFT substrate generally utilizes the single-gate oxide semiconductor thin film transistor (Single-Gate TFT). The dual gate oxide semiconductor thin film transistor (Dual-Gate) possesses better performance than the single gate oxide semiconductor thin film transistor, For example, the electron mobility is higher, and the current of activation state is larger, and the subthreshold swing is smaller, and the stability and the uniformity of the threshold voltage are better, and the gate voltage bias and the light stability are better.

In the manufacture of the LCD, the manufacture of the color filter can be accomplished in the process of the TFT array substrate, i.e. utilizing the COA (Color Filter On Array) technology. As shown in FIG. 1, the a structure of a dual gate oxide semiconductor TFT substrate applicable for the LCD utilizing the COA technology according to prior art comprises a substrate 100, a bottom gate 200 on the substrate 100, a gate isolation layer 300 on the substrate 100 and the bottom gate 200, an oxide semiconductor layer 400 on the gate isolation layer 300 above the bottom gate 200, an etching stopper layer 500 on the oxide semiconductor layer 400 and the gate isolation layer 300, a source/a drain 600 on the etching stopper layer 500, a passivation layer 700 on the source/the drain 600 and the etching stopper layer 500, a top gate 800 on the passivation layer 700 above the source/the drain 600, red/green/blue color resist layers 900 on the top gate 800 and the passivation layer 700, a first flat layer 910 on the red/green/blue color resist layers 900 and the passivation layer 700 and an ITO pixel electrode 1100 on the first flat layer 910.

The etching stopper layer 500 is formed with a first via hole 510 and a second via hole 520 correspondingly above the oxide semiconductor layer 400, and the source/the drain 600 respectively contact with the oxide semiconductor layer 400 through the first via hole 510 and the second via hole 520; the passivation layer 700 and the first flat layer 910 is formed with a third via hole 530 correspondingly above the source/the drain 600, and the ITO pixel electrode 1100 contacts with the source/the drain 600 through the third via hole 530.

As manufacturing the dual gate oxide semiconductor TFT substrate, except the substrate 100 and the gate isolation layer 300, every other structure layer is implemented with the pattern process with one photo process. Thus, the number of the required photo processes is more. Obviously, the structure of the dual gate oxide semiconductor TFT substrate applicable for the LCD utilizing the COA technology is more complicated. The procedure of the manufacture method is longer, and the production efficiency is lower, and the production cost is higher.

SUMMARY OF THE INVENTION

An objective of the present invention is to provide a manufacture method of a dual gate oxide semiconductor TFT substrate applicable for the LCD, capable of reducing the number of the photo processes, shortening the manufacture procedure, raising the production efficiency and lowering the production cost.

Another objective of the present invention is to provide a structure of a dual gate oxide semiconductor TFT substrate applicable for the LCD, capable of reducing the number of the photo processes, shortening the manufacture procedure, raising the production efficiency and lowering the production cost.

For realizing the aforesaid objectives, the present invention provides a manufacture method of a dual gate oxide semiconductor TFT substrate, comprising steps of:

step 1, providing a substrate, and deposing a first metal layer on the substrate, and implementing pattern process to the first metal layer with a first photo process to form a bottom gate;

step 2, deposing a bottom gate isolation layer on the bottom gate and the substrate;

step 3, deposing a color resist layer on the bottom gate isolation layer, and sequentially implementing pattern processes to the color resist layer with second, third and fourth photo processes to form red/green/blue color resist layers; then, deposing a flat layer on the red/green/blue color resist layers, and implementing pattern process to the flat layer with a fifth photo process to form flat layers respectively covering the red/green/blue color resist layers;

step 4, deposing an oxide semiconductor layer on the bottom gate isolation layer and the flat layers, and coating a photoresist layer on the oxide semiconductor layer, and employing a halftone mask to implement a sixth photo process: first, implementing exposure, development to the photoresist layer to obtain a first photoresist layer and a second photoresist layer respectively positioned above the bottom gate and the flat layers and covering the oxide semiconductor layer; a thickness of two side areas of the first photoresist layer and a thickness of the second photoresist layer are smaller than a thickness of a middle area of the first photoresist layer;

employing the first photoresist layer and the second photoresist layer to implement etching the oxide semiconductor layer for patterning the oxide semiconductor layer to respectively obtain a first oxide semiconductor layer and a second oxide semiconductor layer on the bottom gate and the flat layers;

step 5, first, removing the two side areas of the first photoresist layer and the second photoresist layer; employing the remaining middle area of the first photoresist layer as being a mask layer to implement ion doping to the two side areas of the first oxide semiconductor layer and the second oxide semiconductor layer, to transform the two side areas of the first oxide semiconductor layer to be a conductor, and to transform the second oxide semiconductor layer to be an oxide conductor layer; then, removing the remaining middle area of the first photoresist layer;

step 6, deposing a top gate isolation layer on the first oxide semiconductor layer, the oxide conductor layer and the bottom gate isolation layer, and implementing pattern process to the top gate isolation layer with a seventh photo process, to respectively form first via holes above the two side areas of the first oxide semiconductor layer and a second via hole above the oxide conductor layer;

step 7, deposing second, third metal layers on the top gate isolation layer, and implementing pattern process to the second, third metal layers with an eighth photo process, to respectively obtain a top gate above the first oxide semiconductor layer and a source and a drain at two sides of the top gate;

the source and the drain respectively contact with the two side areas of the first oxide semiconductor layer through the first via holes, and the source contacts with the oxide conductor layer through the second via hole;

step 8, deposing a passivation layer on the top gate, the source, the drain and the top gate isolation layer; implementing pattern process to the passivation layer and the top gate isolation layer at the same time with a ninth photo process to obtain a third via above the oxide conductor layer to expose a portion of the oxide conductor layer;

the bottom gate, the first oxide semiconductor layer, the source, the drain and the top gate construct a dual gate TFT; the oxide conductor layer constructs a pixel electrode of a LCD.

The step 3 further comprises a step of implementing plasma treatment to the bottom gate isolation layer.

The step 4 utilizes physical vapor deposition for deposing the oxide semiconductor layer.

The step 6 utilizes dry etching for implementing pattern process to the top gate isolation layer.

Material of the oxide semiconductor layer is IGZO.

Material of the bottom gate, the source, the drain and the top gate is a stack combination of one or more of molybdenum, titanium, aluminum and copper.

Material of the bottom gate isolation layer and the top gate isolation layer is Silicon Nitride, Silicon Oxide, or a combination of the two.

The present invention further provides a structure of a dual gate oxide semiconductor TFT substrate, comprising a substrate, a bottom gate positioned on the substrate, a bottom gate isolation layer positioned on the substrate and the bottom gate, red/green/blue color resist layers positioned on the bottom gate isolation layer, flat layers correspondingly covering the red/green/blue color resist layers, a first oxide semiconductor layer positioned on the bottom gate isolation layer above the bottom gate, an oxide conductor layer positioned on the flat layers above the red/green/blue color resist layers, a top gate isolation layer on the first oxide semiconductor layer, the oxide conductor layer and the bottom gate isolation layer, a top gate positioned on the bottom gate isolation layer above the oxide semiconductor layer, a source and a drain positioned at two sides of the top gate and on the top gate isolation layer and a passivation layer on the top gate, the source, the drain and the top gate isolation layer;

two areas of the first oxide semiconductor layer are ion doping conductor layers; the top gate isolation layer is provided with first via holes correspondingly above the two side areas of the first oxide semiconductor layer, and the top gate isolation layer is provided with a second via hole correspondingly above the oxide conductor layer, and the top gate isolation layer and the passivation layer are provided with a third via hole correspondingly above the oxide conductor layer;

the source and the drain respectively contact with the two side areas of the first oxide semiconductor layer through the first via holes; the source contacts with the oxide conductor layer through the second via hole; the third via hole exposes a portion of the oxide conductor layer;

the bottom gate, the first oxide semiconductor layer, the source, the drain and the top gate construct a dual gate TFT; the oxide conductor layer constructs a pixel electrode of a LCD.

Material of the first oxide semiconductor layer is IGZO, and the oxide conductor layer is manufactured by implementing ion doping to the IGZO semiconductor layer;

Material of the bottom gate isolation layer and the top gate isolation layer is Silicon Nitride, Silicon Oxide, or a combination of the two; material of the bottom gate, the top gate, the source and the drain is a stack combination of one or more of molybdenum, titanium, aluminum and copper.

The present invention further provides a structure of a dual gate oxide semiconductor TFT substrate, comprising a substrate, a bottom gate positioned on the substrate, a bottom gate isolation layer positioned on the substrate and the bottom gate, red/green/blue color resist layers positioned on the bottom gate isolation layer, flat layers correspondingly covering the red/green/blue color resist layers, a first oxide semiconductor layer positioned on the bottom gate isolation layer above the bottom gate, an oxide conductor layer positioned on the flat layers above the red/green/blue color resist layers, a top gate isolation layer on the first oxide semiconductor layer, the oxide conductor layer and the bottom gate isolation layer, a top gate positioned on the bottom gate isolation layer above the oxide semiconductor layer, a source and a drain positioned at two sides of the top gate and on the top gate isolation layer and a passivation layer on the top gate, the source, the drain and the top gate isolation layer;

two areas of the first oxide semiconductor layer are ion doping conductor layers; the top gate isolation layer is provided with first via holes correspondingly above the two side areas of the first oxide semiconductor layer, and the top gate isolation layer is provided with a second via hole correspondingly above the oxide conductor layer, and the top gate isolation layer and the passivation layer are provided with a third via hole correspondingly above the oxide conductor layer;

the source and the drain respectively contact with the two side areas of the first oxide semiconductor layer through the first via holes; the source contacts with the oxide conductor layer through the second via hole; the third via hole exposes a portion of the oxide conductor layer;

the bottom gate, the first oxide semiconductor layer, the source, the drain and the top gate construct a dual gate TFT; the oxide conductor layer constructs a pixel electrode of a LCD;

wherein material of the first oxide semiconductor layer is IGZO, and the oxide conductor layer is manufactured by implementing ion doping to the IGZO semiconductor layer;

wherein material of the bottom gate isolation layer and the top gate isolation layer is Silicon Nitride, Silicon Oxide, or a combination of the two; material of the bottom gate, the top gate, the source and the drain is a stack combination of one or more of molybdenum, titanium, aluminum and copper.

The benefits of the present invention are: the manufacture method of the dual gate oxide semiconductor TFT substrate provided by the present invention utilizes the halftone mask to implement one photo process, which cannot only accomplish the patterning to the oxide semiconductor layer but also obtain the oxide conductor layer with ion doping process, and the oxide conductor layer is employed as being the pixel electrode of the LCD to replace the ITO pixel electrode in prior art; the method manufactures the source, the drain and the top gate at the same time with one photo process; the method implements patterning process to the passivation layer and the top gate isolation layer together with one photo process, to reduce the number of the photo processes to nine for shortening the manufacture procedure, raising the production efficiency and lowering the production cost. The structure of the dual gate oxide semiconductor TFT substrate provided by the present invention, by positioning the oxide conductor layer to be the pixel electrode of the LCD, and positioning all of the source, the drain and the top gate on the top gate isolation layer, simplifies the structure of the TFT substrate on one hand and reduce the number of the photo processes for shortening the manufacture procedure, raising the production efficiency and lowering the production cost on the other hand.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
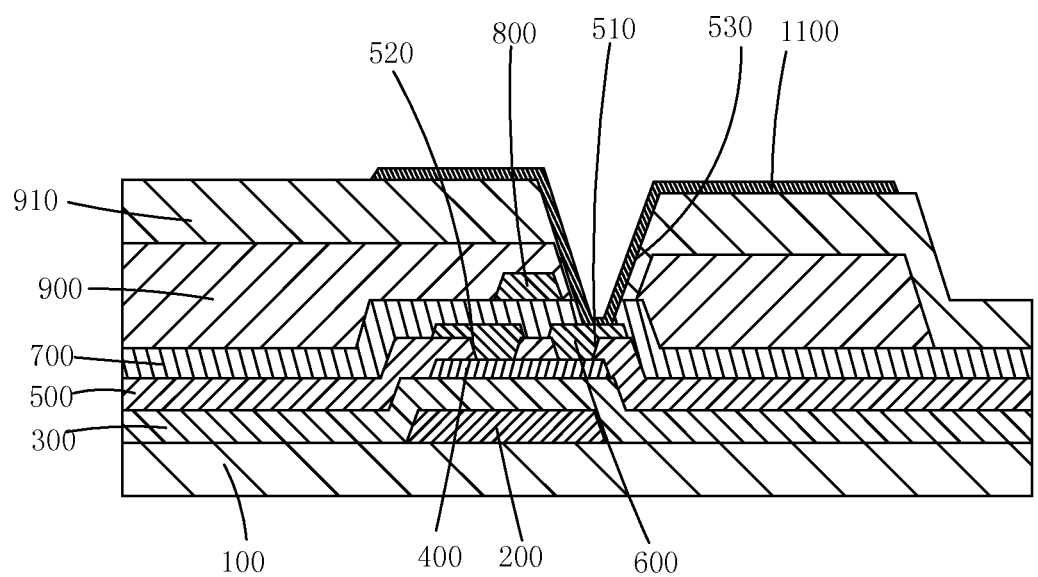
FIG. 1 is a sectional diagram of a structure of a dual gate oxide semiconductor TFT substrate applicable for the LCD utilizing the COA technology according to prior art.
Figure 2:
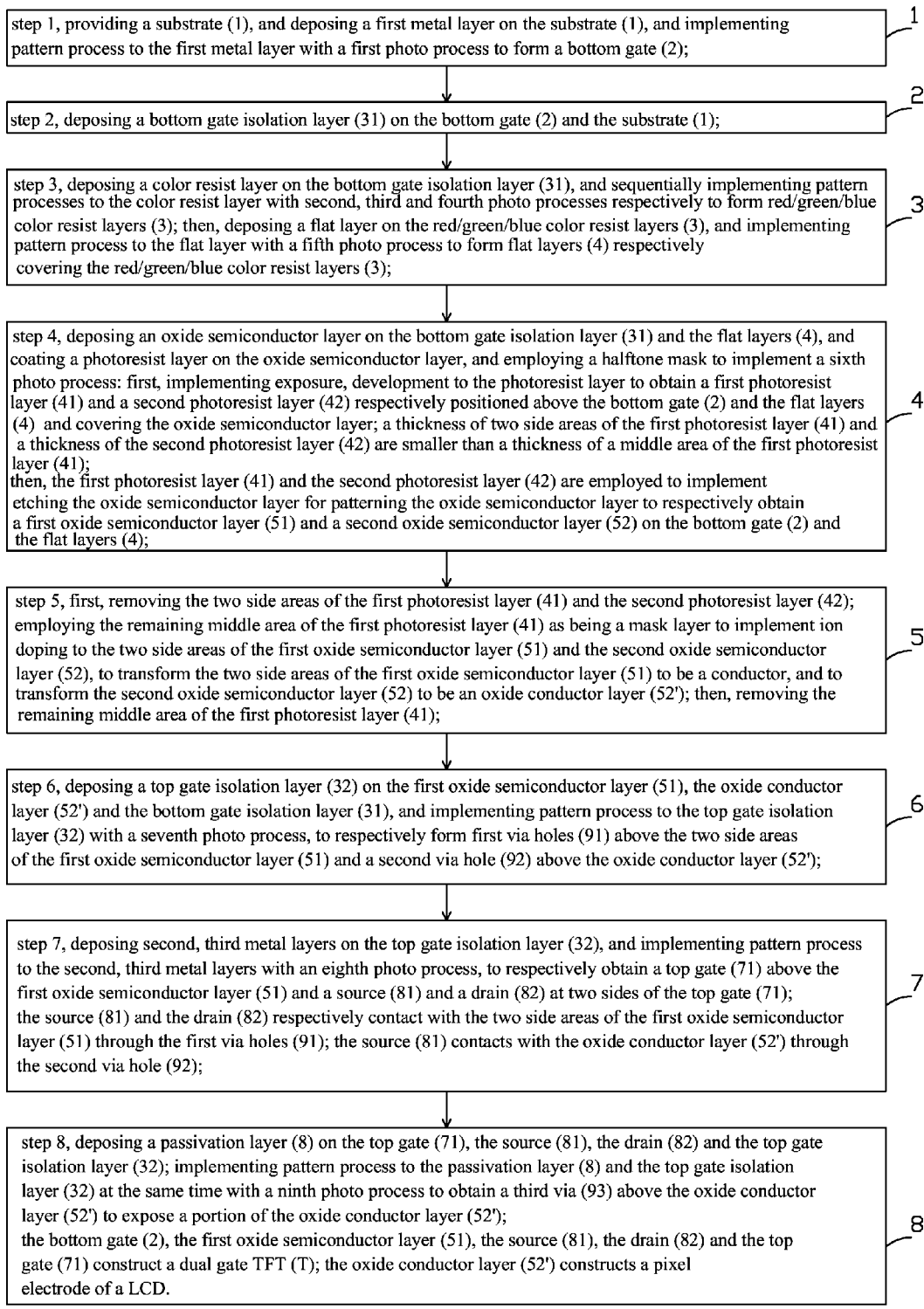
FIG. 2 is a flowchart of a manufacture method of a dual gate oxide semiconductor TFT substrate according to the present invention.
Figure 3:
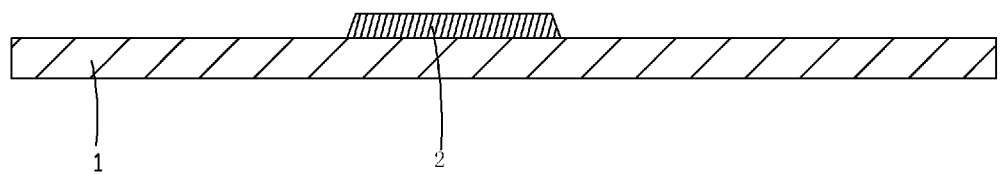
FIG. 3 is a diagram of step 1 of the manufacture method of the dual gate oxide semiconductor TFT substrate according to the present invention.

Please refer to FIG. 2. The present invention first provides a manufacture method of a dual gate oxide semiconductor TFT substrate applicable for the LCD, comprising steps of:

step 1, as shown in FIG. 3, providing a substrate 1, and deposing a first metal layer on the substrate 1, and implementing pattern process to the first metal layer with a first photo process to form a bottom gate 2.

Specifically, the substrate 1 is a transparent substrate. Preferably, the substrate 1 is a glass substrate.

Material of the first metal layer is a stack combination of one or more of one or more of molybdenum (Mo), titanium (Ti), aluminum (Al) and copper (Cu). That is to say, material of the bottom gate 2 is a stack combination of one or more of molybdenum, titanium, aluminum and copper.

Figure 4:
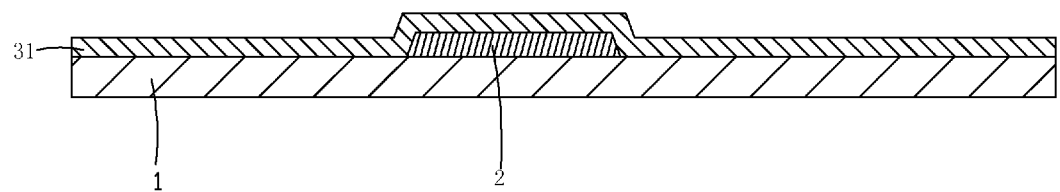
FIG. 4 is a diagram of step 2 of the manufacture method of the dual gate oxide semiconductor TFT substrate according to the present invention.

Step 2, as shown in FIG. 4, deposing a bottom gate isolation layer 31 on the bottom gate 2 and the substrate 1.

Specifically, material of the bottom gate isolation layer 31 is Silicon Nitride (SiNx), Silicon Oxide (SiOx), or a combination of the two.

Figure 5:
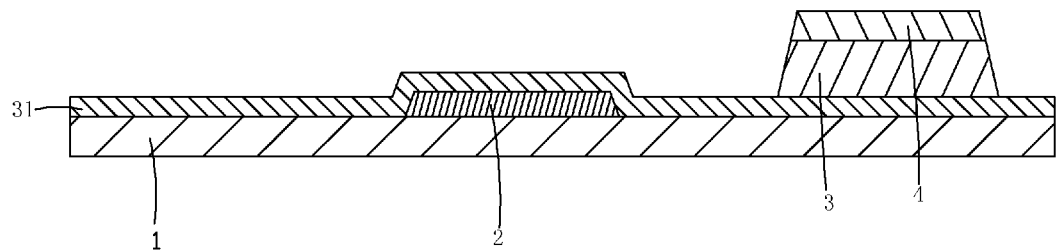
FIG. 5 is a diagram of step 3 of the manufacture method of the dual gate oxide semiconductor TFT substrate according to the present invention.

Step 3, as shown in FIG. 5, deposing a color resist layer on the bottom gate isolation layer 31, and sequentially implementing pattern processes to the color resist layer with second, third and fourth photo processes respectively to form red/green/blue color resist layers 3; then, deposing a flat layer on the red/green/blue color resist layers 3, and implementing pattern process to the flat layer with a fifth photo process to form flat layers 4 respectively covering the red/green/blue color resist layers 3.

Material of the flat layers 4 is organic photoresist capable of covering and protecting the red/green/blue color resist layers 3.

Furthermore, the step 3 further comprises a step of implementing plasma treatment to the bottom gate isolation layer 31 to improve the film quality of the bottom gate isolation layer 31.

Figure 6:
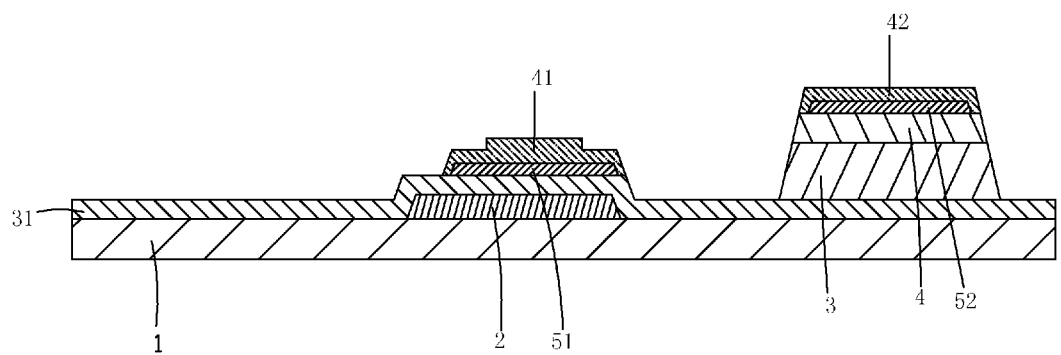
FIG. 6 is a diagram of step 4 of the manufacture method of the dual gate oxide semiconductor TFT substrate according to the present invention.

Step 4, as shown in FIG. 6, deposing an oxide semiconductor layer on the bottom gate isolation layer 31 and the flat layers 4, and coating a photoresist layer on the oxide semiconductor layer, and employing a halftone mask to implement a sixth photo process: first, implementing exposure, development to the photoresist layer to obtain a first photoresist layer 41 and a second photoresist layer 42 respectively positioned above the bottom gate 2 and the flat layers 4 and covering the oxide semiconductor layer; a thickness of two side areas of the first photoresist layer 41 and a thickness of the second photoresist layer 42 are smaller than a thickness of a middle area of the first photoresist layer 41.

Then, the first photoresist layer 41 and the second photoresist layer 42 are employed to implement etching the oxide semiconductor layer for patterning the oxide semiconductor layer to respectively obtain a first oxide semiconductor layer 51 and a second oxide semiconductor layer 52 on the bottom gate 2 and the flat layers 4.

Specifically, the step 4 utilizes physical vapor deposition (PVD) for deposing the transparent oxide semiconductor layer.

Material of the oxide semiconductor layer is Indium Gallium Zinc Oxide (IGZO).

Figure 7:
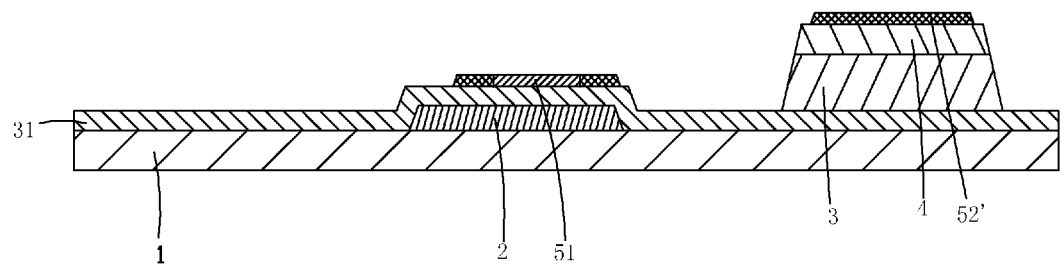
FIG. 7 is a diagram of step 5 of the manufacture method of the dual gate oxide semiconductor TFT substrate according to the present invention.

Step 5, as shown in FIG. 7, first, removing the two side areas of the first photoresist layer 41 and the second photoresist layer 42; employing the remaining middle area of the first photoresist layer 41 as being a mask layer to implement ion doping to the two side areas of the first oxide semiconductor layer 51 and the second oxide semiconductor layer 52, to transform the two side areas of the first oxide semiconductor layer 51 to be a conductor, and to transform the second oxide semiconductor layer 52 to be an oxide conductor layer 52'; then, removing the remaining middle area of the first photoresist layer 41.

Figure 8:
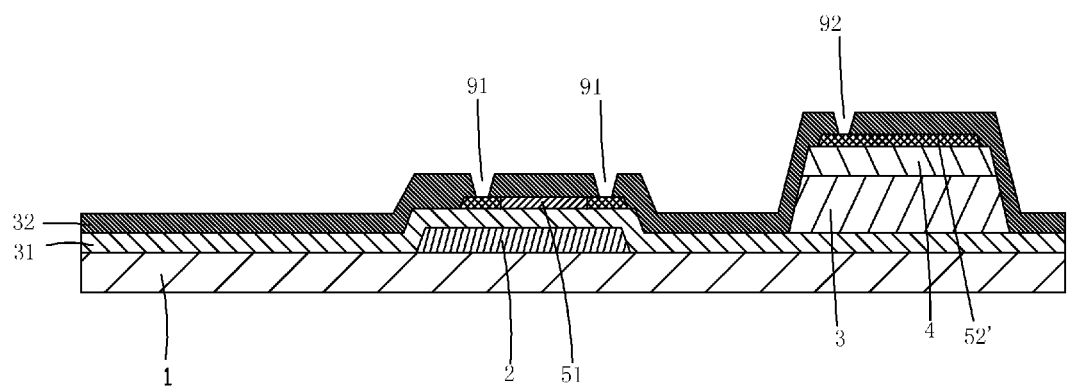
FIG. 8 is a diagram of step 6 of the manufacture method of the dual gate oxide semiconductor TFT substrate according to the present invention.

Step 6, as shown in FIG. 8, deposing a top gate isolation layer 32 on the first oxide semiconductor layer 51, the oxide conductor layer 52' and the bottom gate isolation layer 31, and implementing pattern process to the top gate isolation layer 32 with a seventh photo process, to respectively form first via holes 91 above the two side areas of the first oxide semiconductor layer 51 and a second via hole 92 above the oxide conductor layer 52'.

Specifically, the step 6 utilizes dry etching for implementing pattern process to the top gate isolation layer 32.

Material of the top gate isolation layer 32 is Silicon Nitride, Silicon Oxide, or a combination of the two.

Figure 9:
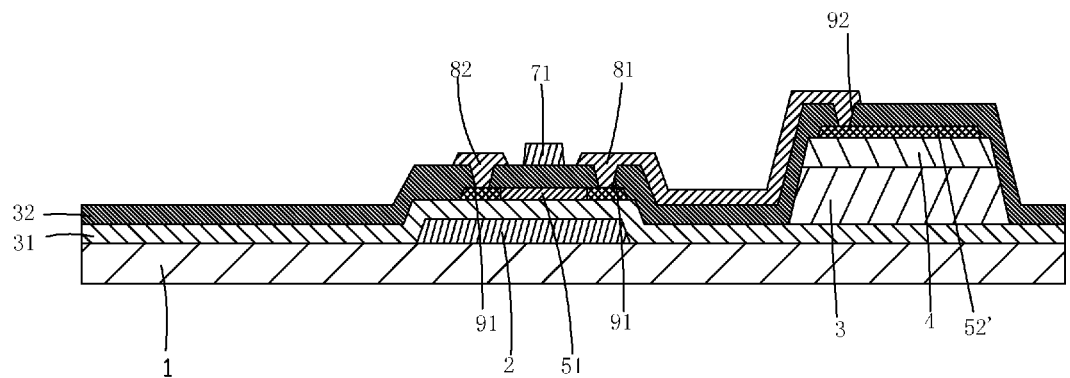
FIG. 9 is a diagram of step 7 of the manufacture method of the dual gate oxide semiconductor TFT substrate according to the present invention.

Step 7, as shown in FIG. 9, deposing second, third metal layers on the top gate isolation layer 32, and implementing pattern process to the second, third metal layers with an eighth photo process, to respectively obtain a top gate 71 above the first oxide semiconductor layer 51 and a source 81 and a drain 82 at two sides of the top gate 71.

The source 81 and the drain 82 respectively contact with the two side areas of the first oxide semiconductor layer 51 through the first via holes 91; the source 81 contacts with the oxide conductor layer 52' through the second via hole 92.

Specifically, material of the second, third metal layers is a stack combination of one or more of one or more of molybdenum, titanium, aluminum and copper. That is to say, material of the source 81, the drain 82 and the top gate 71 is a stack combination of one or more of molybdenum, titanium, aluminum and copper.

Figure 10:
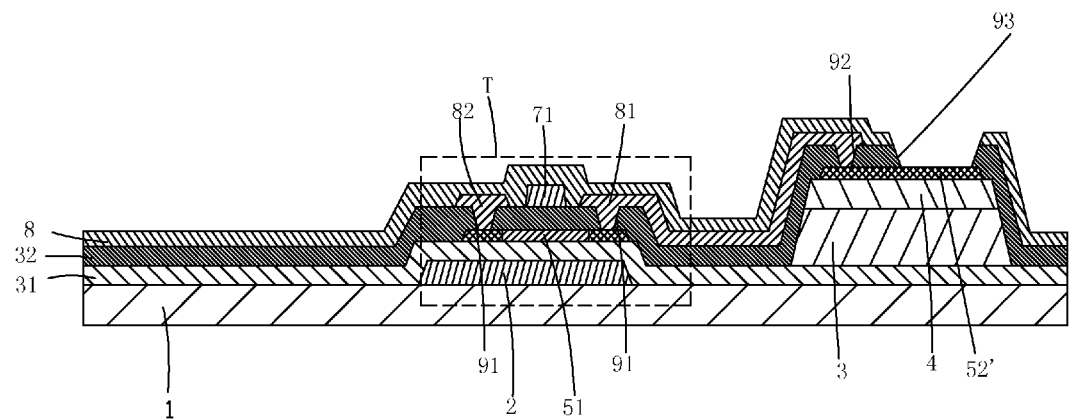
FIG. 10 is a diagram of step 8 of the manufacture method of the dual gate oxide semiconductor TFT substrate according to the present invention and a sectional diagram of a structure of a dual gate oxide semiconductor TFT substrate according to the present invention.

Step 8, as shown in FIG. 10, deposing a passivation layer 8 on the top gate 71, the source 81, the drain 82 and the top gate isolation layer 32; implementing pattern process to the passivation layer 8 and the top gate isolation layer 32 at the same time with a ninth photo process to obtain a third via 93 above the oxide conductor layer 52' to expose a portion of the oxide conductor layer 52'.

The bottom gate 2, the first oxide semiconductor layer 51, the source 81, the drain 82 and the top gate 71 construct a dual gate TFT T; the oxide conductor layer 52' constructs a pixel electrode of a LCD.

The aforesaid manufacture method of the dual gate oxide semiconductor TFT substrate utilizes the halftone mask to implement one photo process, which cannot only accomplish the patterning to the oxide semiconductor layer but also obtain the oxide conductor layer 52' with ion doping process; the method manufactures the source 81, the drain 82 and the top gate 71 at the same time with one photo process; the method implements patterning process to the passivation layer 8 and the top gate isolation layer 32 together with one photo process, to reduce the number of the photo processes to nine for shortening the manufacture procedure, raising the production efficiency and lowering the production cost.

Please refer to FIG. 10. The present invention also provide a structure of a dual gate oxide semiconductor TFT substrate applicable for the LCD, comprising a substrate 1, a bottom gate 2 positioned on the substrate 1, a bottom gate isolation layer 31 positioned on the substrate 1 and the bottom gate 2, red/green/blue color resist layers 3 positioned on the bottom gate isolation layer 31, flat layers 4 correspondingly covering the red/green/blue color resist layers 3, a first oxide semiconductor layer 51 positioned on the bottom gate isolation layer 31 above the bottom gate 2, an oxide conductor layer 52' positioned on the flat layers 4 above the red/green/blue color resist layers 3, a top gate isolation layer 32 on the first oxide semiconductor layer 51, the oxide conductor layer 52' and the bottom gate isolation layer 31, a top gate 71 positioned on the bottom gate isolation layer 32 above the oxide semiconductor layer 51, a source 81 and a drain 82 positioned at two sides of the top gate 71 and on the top gate isolation layer 32 and a passivation layer 8 on the top gate 71, the source 81, the drain 82 and the top gate isolation layer 32.

Specifically, two areas of the first oxide semiconductor layer 51 are ion doping conductor layers; the top gate isolation layer 32 is provided with first via holes 91 correspondingly above the two side areas of the first oxide semiconductor layer 51, and the top gate isolation layer 32 is provided with a second via hole 92 correspondingly above the oxide conductor layer 52', and the top gate isolation layer 32 and the passivation layer 8 are provided with a third via hole 93 correspondingly above the oxide conductor layer 52'.

The source 81 and the drain 82 respectively contact with the two side areas of the first oxide semiconductor layer 51 through the first via holes 91; the source 81 contacts with the oxide conductor layer 52' through the second via hole 92; the third via hole 93 exposes a portion of the oxide conductor layer 52'.

The bottom gate 21, the first oxide semiconductor layer 51, the source 81, the drain 82 and the top gate 71 construct a dual gate TFT T; the oxide conductor layer 52' constructs a pixel electrode of a LCD.

Material of the first oxide semiconductor layer 51 is IGZO, and the oxide conductor layer 52' is manufactured by implementing ion doping to the IGZO semiconductor layer. Material of the bottom gate isolation layer 31 and the top gate isolation layer 32 is Silicon Nitride, Silicon Oxide, or a combination of the two; material of the bottom gate 2, the top gate 71, the source 81 and the drain 82 is a stack combination of one or more of molybdenum, titanium, aluminum and copper.

The aforesaid structure of the dual gate oxide semiconductor TFT substrate positions the oxide conductor layer 52' to be the pixel electrode of the LCD, and the oxide conductor layer 52' and the first oxide semiconductor layer 51 are manufactured by one photo process; the method positions all of the source 81, the drain 82 and the top gate 71 on the top gate isolation layer 32 to simplify the structure of the TFT substrate on one hand and to reduce the number of the photo processes for shortening the manufacture procedure, raising the production efficiency and lowering the production cost on the other hand.

In conclusion, the manufacture method of the dual gate oxide semiconductor TFT substrate provided by the present invention utilizes the halftone mask to implement one photo process, which cannot only accomplish the patterning to the oxide semiconductor layer but also obtain the oxide conductor layer with ion doping process, and the oxide conductor layer is employed as being the pixel electrode of the LCD to replace the ITO pixel electrode in prior art; the method manufactures the source, the drain and the top gate at the same time with one photo process; the method implements patterning process to the passivation layer and the top gate isolation layer together with one photo process, to reduce the number of the photo processes to nine for shortening the manufacture procedure, raising the production efficiency and lowering the production cost. The structure of the dual gate oxide semiconductor TFT substrate of the present invention, by positioning the oxide conductor layer to be the pixel electrode of the LCD, and positioning all of the source, the drain and the top gate on the top gate isolation layer, simplifies the structure of the TFT substrate on one hand and reduce the number of the photo processes for shortening the manufacture procedure, raising the production efficiency and lowering the production cost on the other hand.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a dual gate oxide semiconductor TFT substrate, comprising steps of:

step 1, providing a substrate, and deposing a first metal layer on the substrate, and implementing pattern process to the first metal layer with a first photo process to form a bottom gate;

step 2, deposing a bottom gate isolation layer on the bottom gate and the substrate;

step 3, deposing a color resist layer on the bottom gate isolation layer, and sequentially implementing pattern processes to the color resist layer with second, third and fourth photo processes to form red/green/blue color resist layers; then, deposing a flat layer on the red/green/blue color resist layers, and implementing pattern process to the flat layer with a fifth photo process to form flat layers respectively covering the red/green/blue color resist layers;

step 4, deposing an oxide semiconductor layer on the bottom gate isolation layer and the flat layers, and coating a photoresist layer on the oxide semiconductor layer, and employing a halftone mask to implement a sixth photo process: first, implementing exposure, development to the photoresist layer to obtain a first photoresist layer and a second photoresist layer respectively positioned above the bottom gate and the flat layers and covering the oxide semiconductor layer; a thickness of two side areas of the first photoresist layer and a thickness of the second photoresist layer are smaller than a thickness of a middle area of the first photoresist layer;

employing the first photoresist layer and the second photoresist layer to implement etching the oxide semiconductor layer for patterning the oxide semiconductor layer to respectively obtain a first oxide semiconductor layer and a second oxide semiconductor layer on the bottom gate and the flat layers;

step 5, first, removing the two side areas of the first photoresist layer and the second photoresist layer; employing the remaining middle area of the first photoresist layer as being a mask layer to implement ion doping to the two side areas of the first oxide semiconductor layer and the second oxide semiconductor layer, to transform the two side areas of the first oxide semiconductor layer to be a conductor, and to transform the second oxide semiconductor layer to be an oxide conductor layer; then, removing the remaining middle area of the first photoresist layer;

step 6, deposing a top gate isolation layer on the first oxide semiconductor layer, the oxide conductor layer and the bottom gate isolation layer, and implementing pattern process to the top gate isolation layer with a seventh photo process, to respectively form first via holes above the two side areas of the first oxide semiconductor layer and a second via hole above the oxide conductor layer;

step 7, deposing second, third metal layers on the top gate isolation layer, and implementing pattern process to the second, third metal layers with an eighth photo process, to respectively obtain a top gate above the first oxide semiconductor layer and a source and a drain at two sides of the top gate;

the source and the drain respectively contact with the two side areas of the first oxide semiconductor layer through the first via holes, and the source contacts with the oxide conductor layer through the second via hole;

step 8, deposing a passivation layer on the top gate, the source, the drain and the top gate isolation layer; implementing pattern process to the passivation layer and the top gate isolation layer at the same time with a ninth photo process to obtain a third via above the oxide conductor layer to expose a portion of the oxide conductor layer;

the bottom gate, the first oxide semiconductor layer, the source, the drain and the top gate construct a dual gate TFT; the oxide conductor layer constructs a pixel electrode of a LCD.

2. The manufacture method of the dual gate oxide semiconductor TFT substrate according to claim 1, wherein the step 3 further comprises a step of implementing plasma treatment to the bottom gate isolation layer.

3. The manufacture method of the dual gate oxide semiconductor TFT substrate according to claim 1, wherein the step 4 utilizes physical vapor deposition for deposing the oxide semiconductor layer.

4. The manufacture method of the dual gate oxide semiconductor TFT substrate according to claim 1, wherein the step 6 utilizes dry etching for implementing pattern process to the top gate isolation layer.

5. The manufacture method of the dual gate oxide semiconductor TFT substrate according to claim 1, wherein material of the oxide semiconductor layer is IGZO.

6. The manufacture method of the dual gate oxide semiconductor TFT substrate according to claim 1, wherein material of the bottom gate, the source, the drain and the top gate is a stack combination of one or more of molybdenum, titanium, aluminum and copper.

7. The manufacture method of the dual gate oxide semiconductor TFT substrate according to claim 1, wherein material of the bottom gate isolation layer and the top gate isolation layer is Silicon Nitride, Silicon Oxide, or a combination of the two.

* * * * *